(12) United States Patent
Bour et al.

(10) Patent No.: US 7,560,364 B2
(45) Date of Patent: Jul. 14, 2009

(54) DISLOCATION-SPECIFIC LATERAL EPITAXIAL OVERGROWTH TO REDUCE DISLOCATION DENSITY OF NITRIDE FILMS

(75) Inventors: David Bour, Cupertino, CA (US); Sandeep Nijhawan, Los Altos, CA (US); Jacob Smith, Santa Clara, CA (US); Lori Washington, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/429,084

(22) Filed: May 5, 2006

(65) Prior Publication Data

US 2007/0259504 A1 Nov. 8, 2007

(51) Int. Cl.
*H01L 21/20* (2006.01)

(52) U.S. Cl. .......... 438/481; 257/E21.09; 257/E21.133; 257/E21.158; 257/E21.134; 257/E21.461; 438/41; 438/341; 438/117

(58) Field of Classification Search ................. 438/341, 438/481; 117/45; 257/E21.566
See application file for complete search history.

(56) References Cited

U.S. PATENT DOCUMENTS

| | | | | |
|---|---|---|---|---|
| 4,855,249 | A * | 8/1989 | Akasaki et al. | 117/95 |
| 6,225,650 | B1 * | 5/2001 | Tadatomo et al. | 257/190 |
| 6,475,277 | B1 * | 11/2002 | Hirota et al. | 117/106 |
| 6,503,610 | B2 * | 1/2003 | Hiramatsu et al. | 428/210 |
| 6,576,533 | B2 * | 6/2003 | Tomiya et al. | 438/481 |
| 6,627,974 | B2 * | 9/2003 | Kozaki et al. | 257/623 |
| 6,656,269 | B2 * | 12/2003 | Tomioka | 117/89 |
| 6,693,021 | B1 * | 2/2004 | Motoki et al. | 438/481 |
| 6,784,074 | B2 * | 8/2004 | Shchukin et al. | 438/412 |
| 6,794,210 | B2 * | 9/2004 | Ouchi et al. | 438/46 |
| 6,812,053 | B1 * | 11/2004 | Kong et al. | 438/48 |
| 6,852,253 | B2 * | 2/2005 | Tomioka | 264/1.21 |
| 6,861,729 | B2 * | 3/2005 | Kozaki et al. | 257/623 |
| 7,052,979 | B2 * | 5/2006 | Nagai et al. | 438/478 |
| 7,101,444 | B2 * | 9/2006 | Shchukin et al. | 148/33 |
| 2001/0012678 | A1 * | 8/2001 | Tanaka et al. | 438/481 |
| 2002/0005593 | A1 | 1/2002 | Bourret-Courchesne | |
| 2002/0022290 | A1 | 2/2002 | Kong et al. | |
| 2002/0043208 | A1 * | 4/2002 | Biwa et al. | 117/94 |

(Continued)

OTHER PUBLICATIONS

Huang, et al. "Improvement of InGaN-GaN Light-Emitting Diode Performance With a Nono-Roughened p-GaN Surface"; *IEEE Photonics Technology Letters*, vol. 17, No. 5, May 2005.

(Continued)

*Primary Examiner*—N Drew Richards
*Assistant Examiner*—Ankush k Singal
(74) *Attorney, Agent, or Firm*—Townsend and Townsend and Crew LLP

(57) ABSTRACT

In accordance with the present invention, improved methods for reducing the dislocation density of nitride epitaxial films are provided. Specifically, an in-situ etch treatment is provided to preferentially etch the dislocations of the nitride epitaxial layer to prevent threading of the dislocations through the nitride epitaxial layer. Subsequent to etching of the dislocations, an epitaxial layer overgrowth is performed. In certain embodiments, the etching of the dislocations occurs simultaneously with growth of the epitaxial layer. In other embodiments, a dielectric mask is deposited within the etch pits formed at the dislocations prior to the epitaxial layer overgrowth.

23 Claims, 11 Drawing Sheets

U.S. PATENT DOCUMENTS

| | | | |
|---|---|---|---|
| 2003/0001161 A1* | 1/2003 | Ota et al. | 257/79 |
| 2003/0183160 A1* | 10/2003 | Fujikura et al. | 117/86 |
| 2003/0207125 A1* | 11/2003 | Sunakawa et al. | 428/428 |
| 2004/0082150 A1* | 4/2004 | Kong et al. | 438/481 |
| 2004/0238832 A1* | 12/2004 | Takahashi et al. | 257/86 |
| 2005/0042787 A1* | 2/2005 | Ito et al. | 438/41 |
| 2005/0048685 A1* | 3/2005 | Shibata | 438/46 |
| 2005/0124143 A1 | 6/2005 | Roycroft et al. | |
| 2005/0161702 A1* | 7/2005 | Linthicum et al. | 257/183 |
| 2006/0191474 A1* | 8/2006 | Chen et al. | 117/104 |
| 2006/0252236 A1* | 11/2006 | Chen et al. | 438/481 |
| 2006/0261353 A1* | 11/2006 | Bandoh | 257/79 |
| 2006/0286782 A1* | 12/2006 | Gaska et al. | 438/483 |

OTHER PUBLICATIONS

Hiramatsu, et al. "Fabrication and characterization of low defect density GaN using facet-controlled epitaxial lateral overgrowth (FACELO)"; *Journal of Crystal Growth*; 2000 Elsevier Science B.V.; 221 (2000) 316-326.

* cited by examiner

DISLOCATION-SPECIFIC LATERAL EPITAXIAL OVERGROWTH TO REDUCE DISLOCATION DENSITY OF NITRIDE FILMS

CROSS-REFERENCES TO RELATED APPLICATIONS

This application is related to the following copending, commonly assigned application, the entire disclosure of which is incorporated herein by reference for all purposes: U.S. application Ser. No. 11/418,642, entitled "DISLOCATION-SPECIFIC DIELECTRIC MASK DEPOSITION AND LATERAL EPITAXIAL OVERGROWTH TO REDUCE DISLOCATION DENSITY OF NITRIDE FILMS."

BACKGROUND OF THE INVENTION

Epitaxial wafer materials are widely used as starting materials in semiconductor device fabrication. The presence of defects in such wafer materials can seriously affect the subsequent device performance. For example, GaN and its related compounds InGaN and AlGaN are widely used in the fabrication of short-wavelength semiconductor laser diodes. The performance of such laser diodes is seriously degraded by the presence of threading dislocations, which thread vertically through the epitaxial layers. Similar defects are found in other material systems, for example, when GaAs is grown on SiGe/Si. A reduced dislocation density on the epitaxial wafer materials is therefore desired. It shall be understood in the following descriptions that GaN shall also refer to its compounds (In)(Al)(Ga)N, and may be p-type, n-type or undoped.

A previous approach to reducing the defect density of epitaxial wafer materials is Epitaxial Layer Over-Growth (ELOG) described in US patent application US 2002/0022290. In this approach, narrow stripes of silicon dioxide are patterned on a GaN buffer layer. GaN growth is then restarted until the $SiO_2$ stripes are covered and a planar surface is achieved. The defects under the stripes are blanked out and epitaxial material above the stripes apparently has a lower defect density than the material grown between the stripes. The material above the $SiO_2$ is found to be of high quality, but the material between the stripes is unchanged, and so it appears that multiple steps of ELOG need to be made to create large areas of good quality material. Defect density in efficient ELOG growth is reduced from $10^{10}$ $cm^{-2}$ in standard GaN/Sapphire growth, to $10^8$ $cm^{-2}$ in single step ELOG, or to $5 \times 10^5$ $cm^{-2}$ after multiple steps of ELOG. A defect density of $5 \times 10^5$ $cm^{-2}$ corresponds to 1 defect per 14 $\mu m \times 14$ $\mu m$ square area. Therefore, the size of a defect-free area is still small in comparison to the 50 mm diameter wafer area available for device fabrication. Another problem is that this approach requires considerable additional effort in processing and regrowth, requiring over 100 $\mu m$ of epitaxial growth for best results.

A second approach, described in US patent application US 2002/0005593 is to grow standard GaN epitaxial layers at high temperature (1000° C.), then deposit a thin layer of GaN at a lower temperature (700-900° C.), then resume growth at the high temperature (1000° C.). It is claimed that this prevents defects from propagating vertically, and reduces the defect density from $>10^{10}$ $cm^{-2}$ to $4 \times 10^7$ $cm^{-2}$. This approach suffers from insufficient removal of defects.

A third approach is the direct production of GaN substrates from liquid gallium, and nitrogen at very high pressure (45,000 bar) (by Unipress in Poland). This approach suffers from the use of very highly specialized and expensive equipment, and the production of rather small (~1 $cm^2$) GaN crystals.

The present invention provides systems and methods that, at least in part, address these and other issues.

BRIEF SUMMARY OF THE INVENTION

The present invention generally provides systems and methods for reducing the dislocation density of nitride epitaxial layers of semiconductor structures. In a first aspect, the invention provides a method for reducing dislocation density of a nitride semiconductor structure comprising an epitaxial layer. The method generally comprises: providing a substrate to a reaction chamber; forming an epitaxial nitride layer on the substrate, wherein the epitaxial nitride layer comprises lattice mismatch dislocations with the substrate; preferentially etching the lattice mismatch dislocations of the epitaxial nitride layer during formation of the epitaxial nitride layer such that etch pits are formed at the locations of the lattice mismatch dislocations while epitaxial nitride layer is simultaneous grown within the etch pits to thereby prohibit threading of the lattice mismatch dislocations through the epitaxial nitride layer; stopping etching of the epitaxial nitride layer once the lattice mismatch dislocations are preferentially etched with etch pits; and forming a subsequent epitaxial nitride layer over the etched epitaxial nitride layer.

In certain embodiments, the epitaxial nitride layer is formed on the substrate via MOCVD method comprising: introducing at least one nitrogen containing precursor into the reaction chamber; introducing a Group-III organo-metallic precursor and at least one etch compound into the reaction chamber, wherein the nitrogen-containing precursor reacts with the Group-III organo-metallic precursor to form a reaction mixture; and forming the epitaxial nitride layer on the substrate from the reaction mixture comprising the Group-III organo-metallic precursor and the nitrogen-containing precursor under conditions sufficient to allow preferential etching of the lattice mismatch dislocations of the epitaxial nitride layer during formation of the epitaxial nitride layer such that the etch pits are formed at the locations of the lattice mismatch dislocations while the epitaxial nitride layer is simultaneous grown within the etch pits to thereby inhibit threading of the lattice mismatch dislocations through the epitaxial nitride layer.

In other embodiments, the subsequent epitaxial nitride layer is formed on the substrate via a HVPE method comprising: introducing a nitrogen containing reagent gas into the reaction chamber; introducing a group-III metal containing reagent gas into the reaction chamber, wherein the group-III metal containing reagent gas is generated from the reaction of a group-III metal with a halogen containing gas and wherein the nitrogen containing reagent gas reacts with the group-III metal containing reagent gas to form an epitaxial reaction gas mixture; and forming the subsequent epitaxial nitride layer from the epitaxial reaction gas mixture.

In certain aspects of the invention, the epitaxial nitride layer has a thickness of about 1 $\mu m$ to about 5 $\mu m$, and the subsequent epitaxial nitride layer has a thickness of about 1 $\mu m$ or more.

In other aspects of the invention, the dislocation density of subsequent epitaxial layer is reduced to less than about 20%, about 15%, about 10%, about 5%, about 3%, about 2%, etc.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DETAILED DESCRIPTION OF THE INVENTION

Nitride films may be deposited epitaxially by, e.g., MOVPE or MOCVD (Metal-Organic Vapor Phase Epitaxy or Metal-Organic Chemical Vapor Deposition), on sapphire, SiC, or Si substrates, for visible LEDs, near-UV laser diodes, and high power transistors. The performance of these devices is limited by the high dislocation density ($\sim 10^9$ cm$^{-3}$) in the nitride layer, which arises from the large lattice mismatch (16% for the most common substrate, sapphire, and e.g., GaN) between the nitride film and substrate. For example, in light-emitting devices the dislocations represent extended non-radiative defects that serve to reduce the internal quantum efficiency; and also they are involved in device failure. In electronic devices, the presence of dislocations can cause failure or premature breakdown at high bias voltages.

As discussed above, several approaches have already been developed for reducing the dislocation density in nitride epitaxial films to improve their electronic and optoelectronic character. In accordance with the present invention, improved techniques for reducing dislocation density are provided, where the structure is etched in-situ in a manner such that the dislocations are preferentially attacked.

I. Exemplary Nitride Epitaxial Structure

Figure 1:
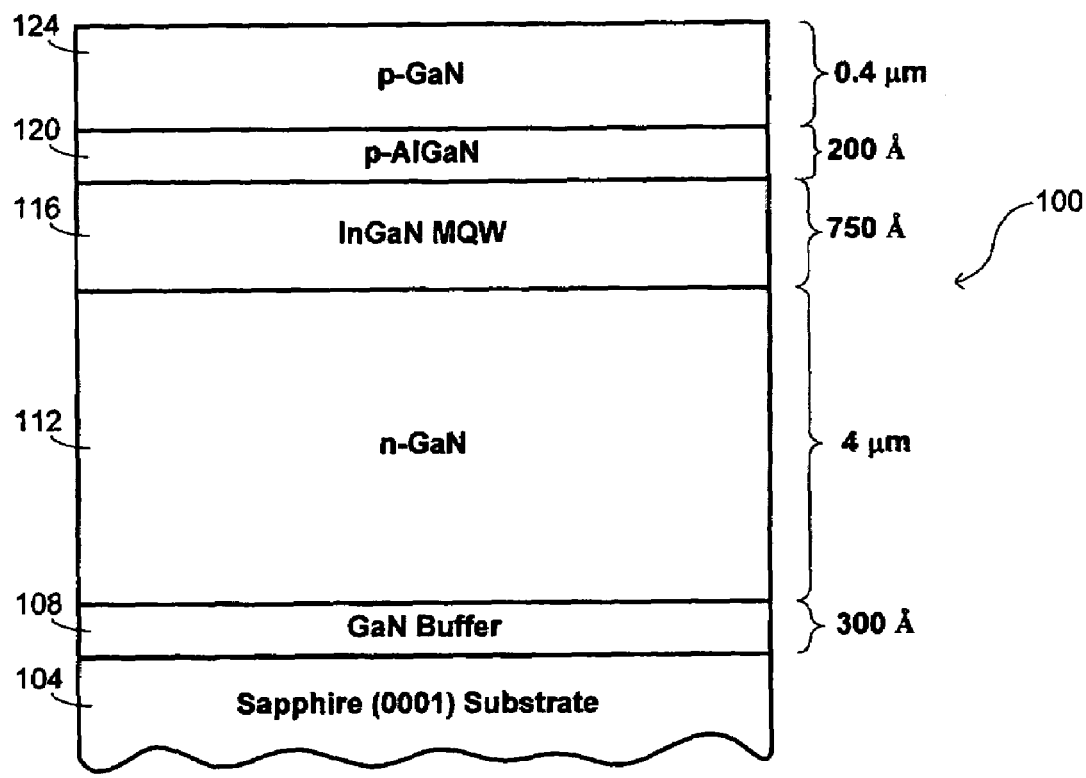
FIG. 1 provides a schematic illustration of a structure of a GaN-based LED.

By way of background, a typical nitride-based structure is illustrated in FIG. 1 as a GaN-based LED structure 100. It is fabricated over a sapphire (0001) substrate 104. An n-type GaN layer 112 is deposited over a GaN buffer layer 108 formed over the substrate. An active region of the device is embodied in a multi-quantum-well layer 116, shown in the drawing to comprise an InGaN layer. A pn junction is formed with an overlying p-type AlGaN layer 120, with a p-type GaN layer 124 acting as a contact layer. Lattice mismatch generally occurs between the sapphire substrate 104, and the GaN layer 112, and the dislocations can propagate, i.e., thread, through the structure. The methods of the invention reduce the dislocation density of such GaN layers, and resulting GaN structures.

II. Exemplary Dislocation-Reduction Methods

Again, a number of approaches have been demonstrated for improving the structural quality of nitride semiconductors on highly-mismatched substrates. These include lateral epitaxial overgrowth (LEO), delayed coalescence, in-situ SiN$_x$ treatments, and temperature cycled growth.

In accordance with the present invention, improved methods for reducing the dislocation density of nitride epitaxial films are provided. Specifically, an in-situ etch treatment is provided to preferentially etch the dislocations of the nitride epitaxial layer to prevent threading of the dislocations through the nitride epitaxial layer.

Figure 2A:
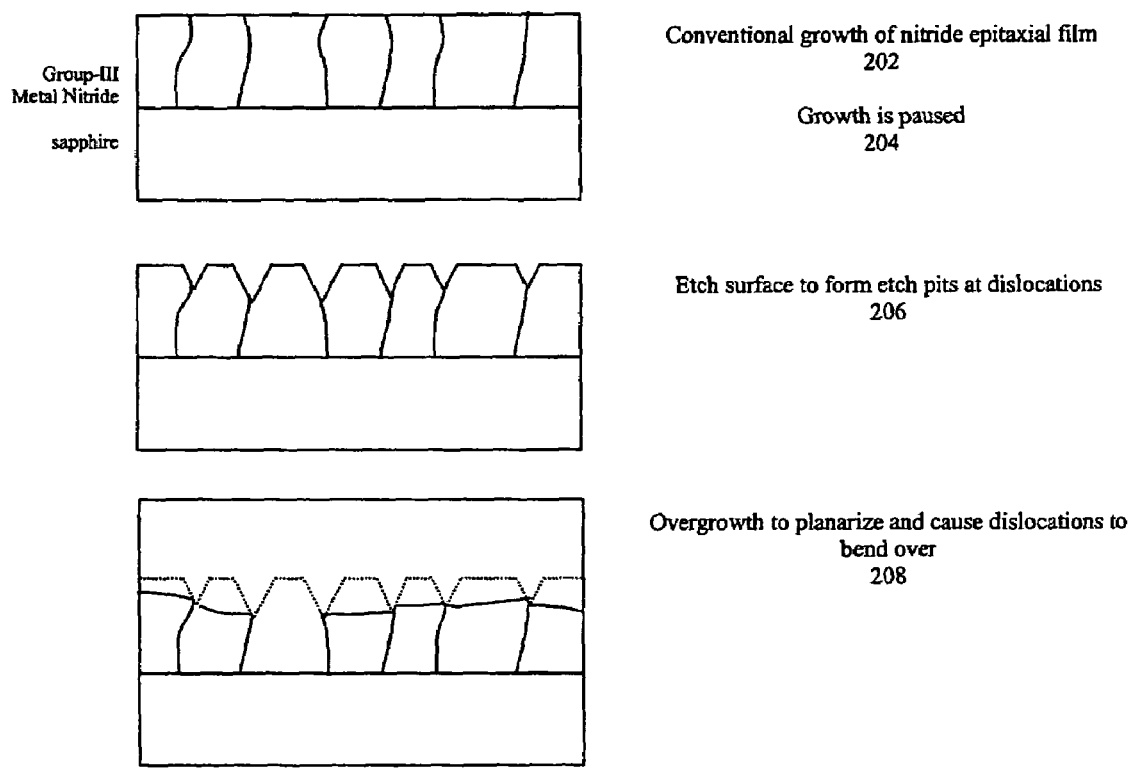
FIG. 2A is a flowchart illustrating steps in a method for reducing dislocation density of a nitride epitaxial layer according to embodiments of the invention.

With reference to FIG. 2A, in one embodiment, a first dislocation-reduction method 200 is disclosed, wherein a nitride epitaxial film is grown in a standard manner known in the art or as described herein 202. Such films generally have a high density of threading dislocations. The growth is then paused 204, and the nitride epitaxial surface is etched with a corrosive halogen gas 206, e.g., HCl, to form an etched hexagonal pit. The etching conditions (temperature, HCl/NH$_3$/H$_2$/N$_2$ flows, illumination, etc.) are chosen such that the dislocations are preferentially attacked, thereby forming etch pits where the dislocations intersect the surface. Subsequently, the growth of the nitride epitaxial layer is continued over the etch pitted surface 208.

Figure 2B:
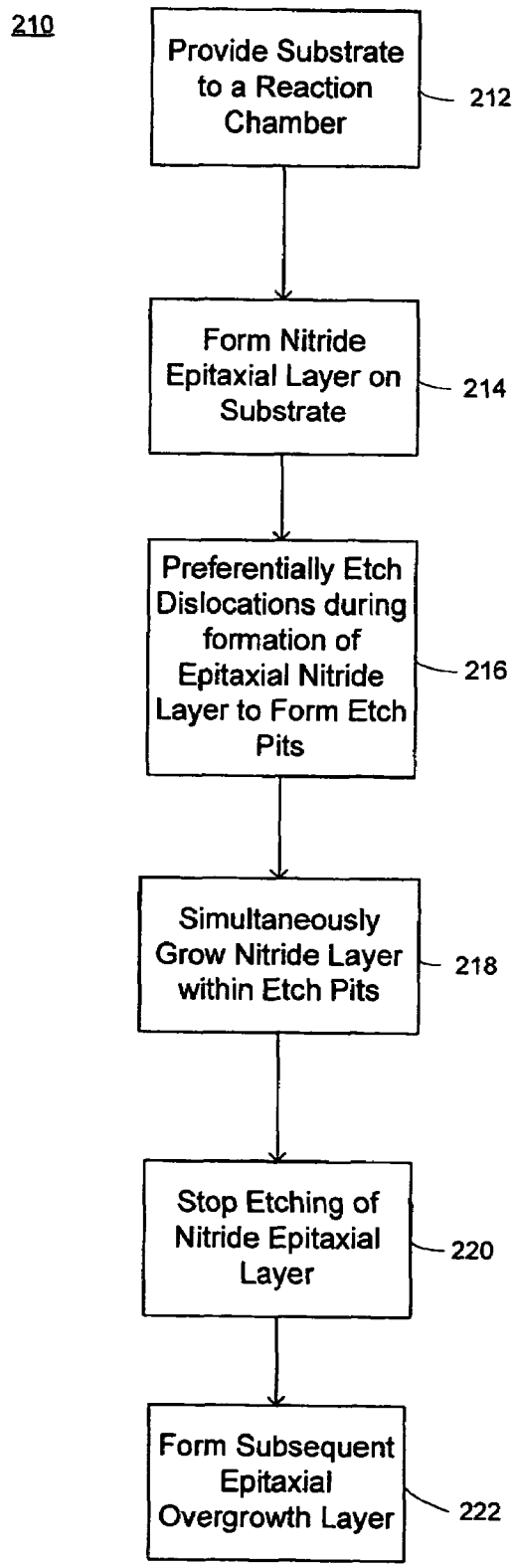
FIG. 2B is a flowchart illustrating steps in a method for reducing dislocation density of a nitride epitaxial layer according to embodiments of the invention

In an alternative embodiment of the dislocation-reduction method shown in FIG. 2A, a dislocation-reduction method 210 is illustrated in FIG. 2B. Method 210 generally includes providing a substrate to a reaction chamber at step 212, followed by forming an epitaxial nitride layer on the substrate at step 214 in a standard manner. Again, the epitaxial nitride layer comprises lattice mismatch dislocations with the substrate. The epitaxial nitride layer is preferentially etched at the lattice mismatch dislocations during formation of the epitaxial nitride layer 216 such that etch pits are formed at the locations of the lattice mismatch dislocations while epitaxial nitride layer is simultaneous grown within the etch pits 218 to thereby prohibit threading of the lattice mismatch dislocations through the epitaxial nitride layer. The etching of the epitaxial nitride layer is then stopped 220 once the lattice mismatch dislocations are preferentially etched with etch pits, and a subsequent epitaxial nitride layer is formed over the etched epitaxial nitride layer 222.

Without being limited by theory, in accordance with certain aspects of the invention, where the dislocations intersect the crystallographic plane comprising the sidewall of the etched pit, the dislocations bend over (as in the FACELO technique whereby the facetted surface is produced during a low-temperature growth) and are therefore prevented from threading through the remainder of the epitaxial film. The growth temperature profile may be adjusted to further filter the threading dislocations (i.e., some form of temperature-cycled growth may be beneficial to enhance the faceting which causes the dislocations to bend over) and ultimately planarize the surface.

Further, in accordance with the invention, the etching of the dislocations are preferential, i.e., dislocation-specific. Other known dislocation-reduction methods such as LEO, temperature-cycling, and SiNx treatment are not dislocation-selective. Rather, they randomly filter the dislocations. In contrast, the etch treatments of the present invention are highly localized.

In certain embodiments, the preferential etch may be performed in the same reaction chamber as the epitaxial layer growth, and in other embodiments, the etch may be performed in a separate reaction chamber.

In certain embodiments, the nitride epitaxial layers are formed via hydride vapor phase epitaxy (HVPE) or hybrid metal-organic HVPE (MO-HVPE) processes. In such embodiments, the etchant is introduced during growth of the initial epitaxial layer, so the etching of the dislocations is performed simultaneously with the initial growth of the epitaxial layer, by properly adjusting the conditions. When properly adjusted, net etching occurs at the defects, with some finite growth rate between the defects. After spending the necessary time under these conditions, and forming the desired etch pits, the growth parameters are then re-adjusted for rapid growth of the low-defect-density epitaxial film.

Figure 3:
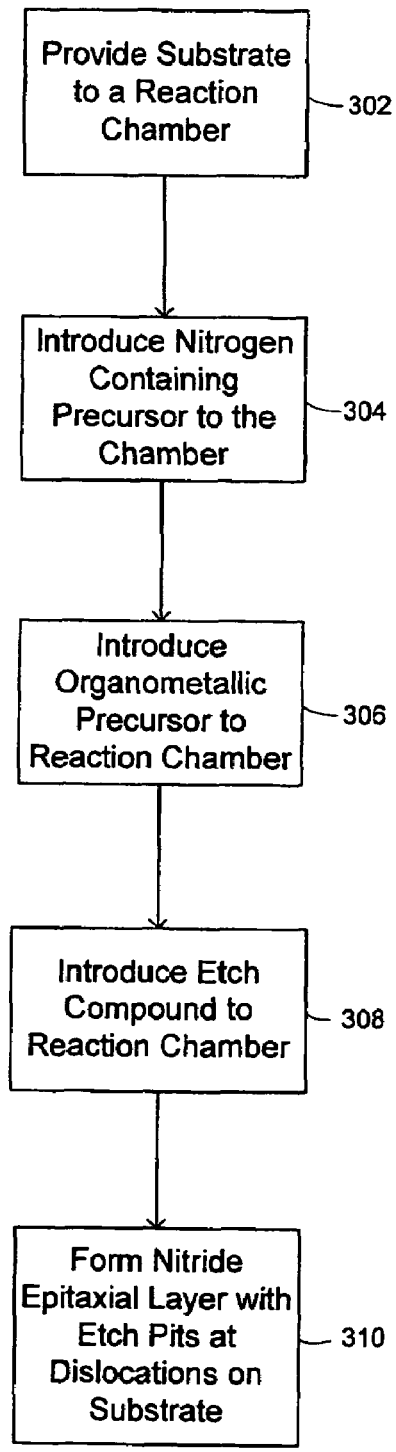
FIG. 3 is a flowchart illustrating steps in processes of forming a nitride epitaxial layer on a substrate according to embodiments of the invention.

In certain embodiments, with reference to FIG. 3, the initial nitride epitaxial layer having lattice mismatch dislocations with the substrate may be formed via method 300. Method 300 includes providing a substrate to a reaction chamber at step 302. The substrate may be any substrate that a nitride epitaxial layer can be formed by either metal-organic chemical vapor deposition (MOCVD) or HVPE. These may include, for example, substrate wafers made from sapphire ($Al_2O_3$), substantially pure silicon (Si), silicon carbide (SiC), spinel, zinc oxide, as well as compound semiconductor substrates such as gallium-arsenide (GaAs), lithium gallate, indium phosphide (InP), and single-crystal GaN among other substrates.

With the substrate in the reaction chamber, a nitrogen-containing precursor, such as ammonia ($NH_3$), is introduced to the reaction chamber at step 304. Continuing to step 306, a Group-III organo-metallic precursor is introduced into the reaction chamber together with at least one etch compound. In certain embodiments, the etch compound may be introduced into the reaction chamber in the same fluid stream as the Group-III organo-metallic precursor, or a separate stream.

The nitrogen-containing precursor reacts with the Group-III organo-metallic precursor in a reaction zone around the deposition surface of the substrate. In certain embodiments, the nitrogen-containing precursor may flow in a separate gas stream into the reaction chamber that intersects with the Group-III organo-metallic precursor gas stream in a space in the heated reaction zone above the substrate. By way of example, the nitrogen containing gas may include nitrogen ($N_2$), ammonia ($NH_3$), hydrazine, dimethylhydrazine, pyenlhydrazine, excited $N_2$, excited $NH_3$, etc.

The organo-metallic precursor may include a Group III metal and a carbon group, among other constituents. For example, the precursor may include an alkyl Group III metal compound such as an alkyl aluminum compound, an alkyl gallium compound, and/or an alkyl indium compound, among others. Specific precursor examples may include trimethylaluminum (TMA), triethyl-aluminum (TEA), trimethylindium (TMI), triethylindium (TEI), trimethylgallium (TMG), and triethylgallium (TEG). Larger sized alkyl groups, such as propyl, pentyl, hexyl, etc., may also be combined with the Group III metal. Different sized alkyl groups may also be combined in the same precursor, such as ethyldimethylgallium, methyldiethyl-aluminum, etc. Other organic moieties such as aromatic groups, alkene groups, alkyne groups, etc. may also be part of the organo-metallic precursor.

Two or more Group-III organo-metallic precursors may be introduced to the reaction chamber to react and form a layer that includes a metallic alloy. For example, the organo-metallic precursors may include two or more Group III metals (e.g., Al, Ga, In) that form a nitride of a Group III alloy on the substrate, such as AlGaN, InGaN, InAlN, InAlGaN, etc. In AlGaN, for example, TMG and TMA may be introduced together into the reaction chamber with a nitrogen precursor (e.g., ammonia) to form the alloyed III-V layer.

The Group-III organo-metallic precursor may also be a halogenated precursor, with the halogen group attached to either the metal atom, the organic moiety, or both. Examples include diethylgallium chloride, chloromethlydiethylgallium, chlorodiethylgallium chloride, etc. When the organo-metallic precursor includes a halogen group, the dissociated halogen may act as a particle suppression constituent during the reaction and deposition of the nucleation layer. In some embodiments, the halogenated Group-III organo-metallic precursor may act as both the particle suppression compound and a Group III metal providing compound during the deposition of the nucleation layer. Embodiments also include providing a halogenated organo-metallic compound in addition to a separate particle suppression compound.

The etch compound may include a halogen group. For example, the etch compound may be a hydrogen halide such as hydrogen fluoride, hydrogen chloride, hydrogen bromide and/or hydrogen iodide. Etch compounds may also include organo-halogen compounds such as an alkyl chloride (e.g., methyl chloride, methylene chloride, chloroform, etc.). The etch compound (or compounds) may be introduced into the reaction chamber at a concentration (i.e., partial pressure) that is sufficient to result in the desired etching of the lattice mismatch dislocations, e.g., at a concentration that is greater than the concentration of the Group III organo-metallic precursor.

Carrier gases such as helium may optionally be used (not shown) to facilitate the flow of the precursors and the etch compounds in the reaction chamber, as well as adjust the total pressure in the chamber. The carrier gas may be premixed with the precursor gas before entering the chamber, and/or may enter the chamber in a unmixed state through a separate flow line.

When the precursors react in the reaction zone, at least a portion of the reaction products forms the nitride epitaxial layer on the substrate at step 310. The nitride epitaxial layer deposition rate and film properties and etch rate may be controlled, at least in part, by adjustable parameters of the reaction chamber, including the chamber temperature, pressure, and fluid flow rate, and partial pressures of the precursors, carrier gases and particle suppression compound(s) such that preferential etching of the lattice mismatch dislocations of the epitaxial nitride layer occurs during formation of the epitaxial nitride layer. More particularly, reaction conditions are controlled such that the etch pits are formed at the locations of the lattice mismatch dislocations while the epitaxial nitride layer is simultaneous grown within the etch pits to thereby prohibit threading of the lattice mismatch dislocations through the epitaxial nitride layer.

For example, the temperature of the reaction zone around the substrate wafer may be adjusted from about 23° C. to about 1100° C. by an external heat source surrounding the reaction chamber. The heat source heats the walls of the reactor (i.e., a hot-walled reaction chamber), which in turn heats the substrate. Under hot-walled reactor conditions, the precursors are heated as they enter the reaction chamber, and can react around the chamber walls as well as the substrate. Because a large amount of precursor reacts away from the substrate surface, the precursor yield (i.e., amount of deposited film versus amount of precursor used) from a hot-walled MOCVD chamber is typically lower than for a cold-walled system.

In a cold-walled reaction chamber, the substrate is heated without first heating the chamber walls. Substrate heating may be done by heating a substrate support structure, heating one or more streams of gases (e.g., the precursors) directed at the substrate, generating a plasma proximate to the substrate, and training a beam of light (e.g., infrared light) on the substrate, among other techniques. Because the highest temperature region in the reaction chamber is more concentrated around the deposition surface of the substrate, less precursor reacts away from the substrate and the precursor yield is generally higher than for hot-walled processes.

The deposition rate and film quality of the nitride epitaxial layer may be determined, in part, by the temperature of the substrate. The temperature of the substrate during deposition may be, for example, up to about 500° C., 600° C., 700° C., 800° C., 900° C., 1000° C. or more. The temperature of the substrate may be adjusted, in part, by controlling the temperature of the of the streams of precursor gases entering the reaction chamber and surrounding the substrate. For example the precursor gases introduced to the reaction chamber may have a temperature ranging from about 15° C. to about 300° C., 400° C., 500° C., 600° C., or 700° C. or more.

The reactor pressure may also be set during the deposition of the epitaxial layer. Embodiments of the invention include total reactor pressures that range from about 25 Torr to about 500 Torr or more.

The reaction chamber conditions may be set to form the nitride epitaxial layer with a deposition rate of, for example, about 2 μm/hr or more, about 5 μm/hr or more, about 10 μm/hr or more, about 25 μm/hr or more, or about 50 μm/hr or more. The deposition time may be, for example, about 1, 5, 10, 15, 20, 30, 45, or 60 minutes or more to form a nitride epitaxial layer with lattice mismatch dislocations that are preferentially etched. Such nitride epitaxial layers, e.g., may have a thickness of about 2 μm to about 4 μm.

Figure 4:
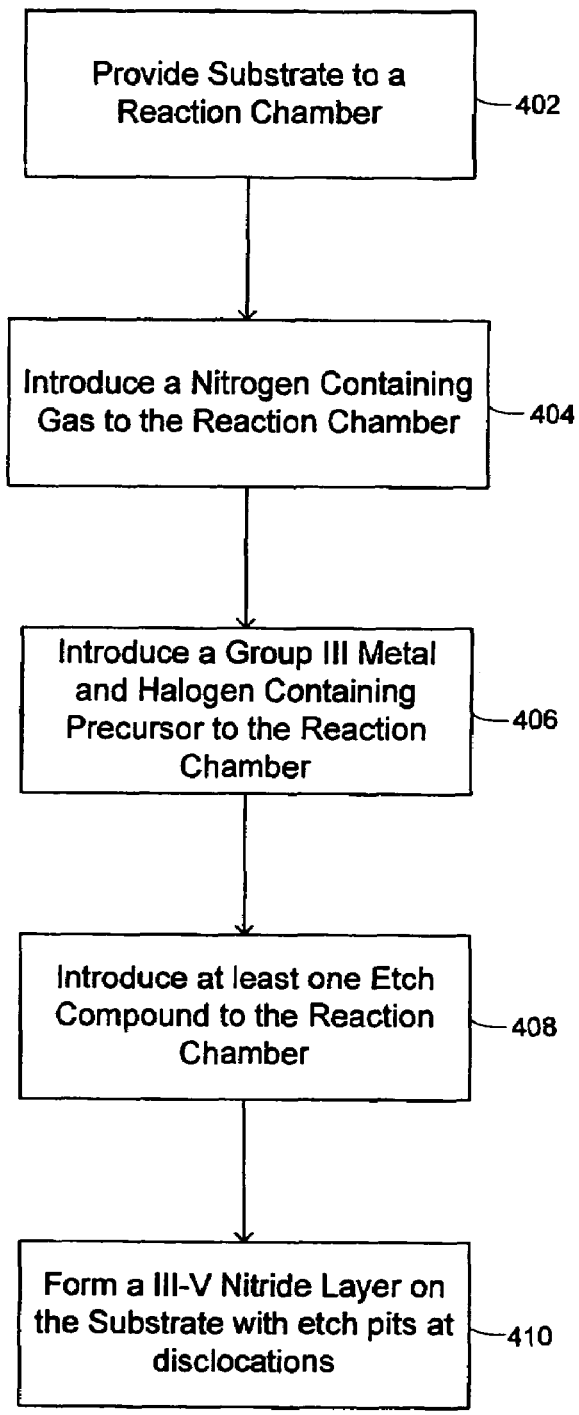
FIG. 4 is a flowchart showing steps in processes of forming a nitride epitaxial layer on a substrate according to embodiments of the invention.

Referring now to FIG. 4, an alternative method 400 for forming the nitride epitaxial layer having lattice mismatch dislocations is shown. Method 400 includes providing a substrate to the reaction chamber at step 402, followed by introducing a nitrogen containing gas is also introduced into the reaction chamber at step 404 to provide the Group V (i.e., nitride) component of the nitride film. The nitrogen containing gas may include nitrogen ($N_2$), ammonia ($NH_3$), hydrazine, dimethylhydrazine, pyenlhydrazine, excited $N_2$, excited $NH_3$, etc.

Continuing to step 406, a Group III metal and halogen containing precursor to the reaction chamber. This precursor may be, for example, a Group III metal fluoride, chloride, bromide and/or iodide (e.g., $AlF_3$, $AlCl_3$, $AlBr_3$, $AlI_3$, GaF, GaCl, GaBr, GaI, InF, InCl, InBr, InI, etc.). It may also be a Group III organo-metallic halide (e.g., dimethylgallium chloride) and/or a Group III metal organo-halide compound (e.g., dichloromethylgallium).

Method 400 continues at step 408 where a separate etch compound is introduced to the reaction chamber in the same or different precursor stream as the Group III metal precursor. The etch compound may, e.g., include HF, HCl, HBr, or HI, alone or in combination.

The Group III metal and halogen containing precursor reacts with the nitrogen containing precursor to form the nitride epitaxial layer on the substrate at step 410. The dissociated halogens from the Group III metal precursor and the separate etch compound present in the reaction zone around the substrate etch the lattice mismatch dislocations that form in the nitride epitaxial layer as the layer is formed, while simultaneous growth of the epitaxial layer occurs within the etch pit itself. The nitride epitaxial layer may be a single metal Group III metal nitride such as AlN, GaN, or InN, or an alloy of two or more Group III metals and nitrogen, such as AlGaN, AlGaIn, etc.

In certain embodiments, following formation of the etch pits on the nitride epitaxial layer with lattice mismatch dislocations, a subsequent nitride epitaxial layer is formed over the etched nitride epitaxial layer via any suitable manner known in the art such as MOCVD, HVPE, etc. As such, combined MOCVD/HVPE processes may be used to form the in-situ etched nitride epitaxial layer and the subsequent nitride epitaxial layer.

Figure 5:
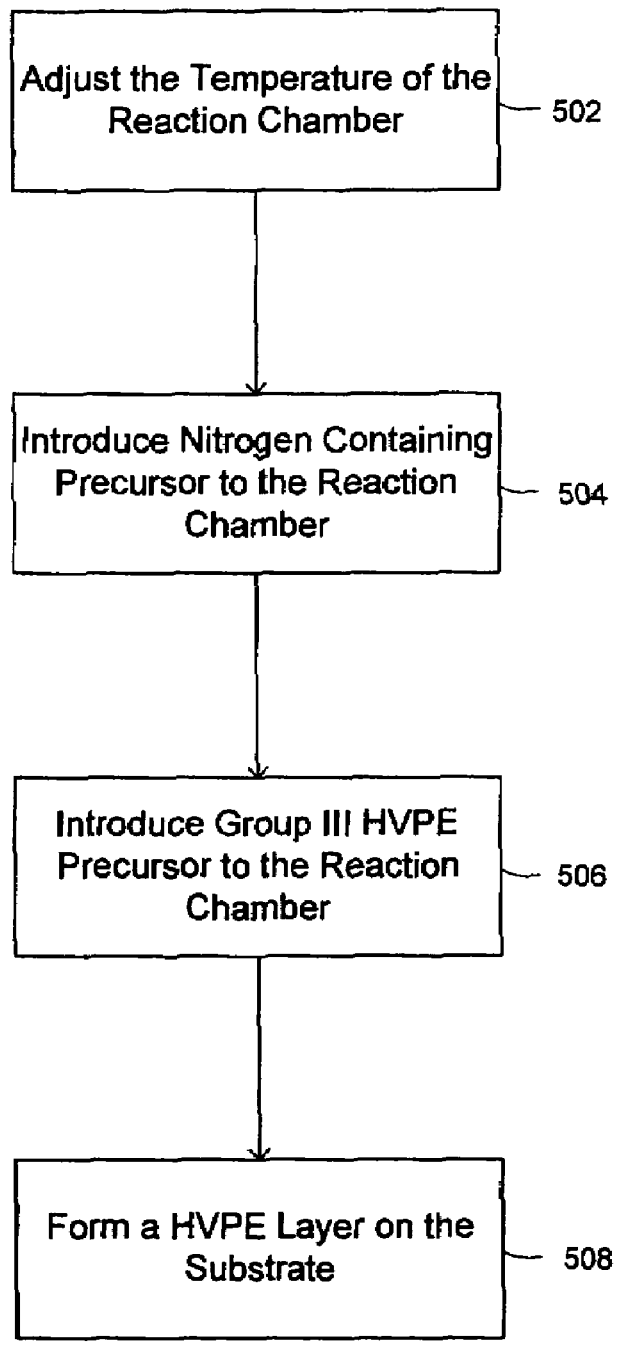
FIG. 5 is a flowchart illustrating steps in combined MOCVD and HVPE processes of forming III-V layers according to embodiments of the invention.

By way of example, with reference to FIG. 5, a HVPE method 500 is illustrated for forming a subsequent nitride epitaxial overgrowth layer. For instance, if the etch process is performed via a MOCVD process, e.g., as illustrated in FIG. 3, following formation of the etch pits, the temperature of the reaction chamber may be adjusted 502 for the deposition of a HVPE layer. For example, HVPE deposition temperatures for forming a III-V nitride layer are about 550° C. to about 1100° C. (e.g., about 800° C. to about 1000° C.). This may be roughly the same as the temperatures typically used to form a III-V nitride layer by MOCVD (e.g., about 1000° C.-1100° C.).

With reference to method 500, a nitrogen precursor is injected into the reaction chamber at step 504, and a Group III HVPE precursor may then be introduced to the reaction chamber at step 506. By way of example, the Group III HVPE precursor may be formed by passing a halogen gas (e.g., HCl) over a heated Group III metal (e.g., liquid gallium, aluminum and/or indium). The halogen gas and metal vapor react to form a metal halide (e.g., GaCl) that is introduced into the reaction chamber by a carrier gas (e.g., helium, hydrogen).

The Group III HVPE precursor may react with a nitrogen precursor in the reaction chamber to deposit at least a portion of the reaction products onto the substrate to form a HVPE layer on the etched nitride epitaxial MOCVD layer at step 508. The HVPE layer may be formed at a faster deposition rate (e.g., up to about 100 μm/hr) than the MOCVD layer. The HVPE layer may also be thicker than the MOCVD layer (e.g., 2, 3, 4, 5, 6, 10, 20, or more times the thickness of the MOCVD layer).

As described above, the methods 300 and 500 may be carried out in a single reaction chamber capable of performing both MOCVD and HVPE, or separate reaction chambers dedicated to a single deposition technique. The system used to perform the methods 300 and 500 may also include reaction chambers for additional etching, lithography, and annealing, among other additional process steps.

As described above, MOCVD is used to from a first layer with lattice mismatch dislocations that are etched to prevent threading of the dislocations to thereby reduce dislocation density of the epitaxial structure, and HVPE is used to form a second epitaxial overgrowth layer on the first etched layer. However, the reverse approach may also be used, wherein HVPE is used to form the first layer and MOCVD is used to form the second overgrowth layer.

Figure 6:
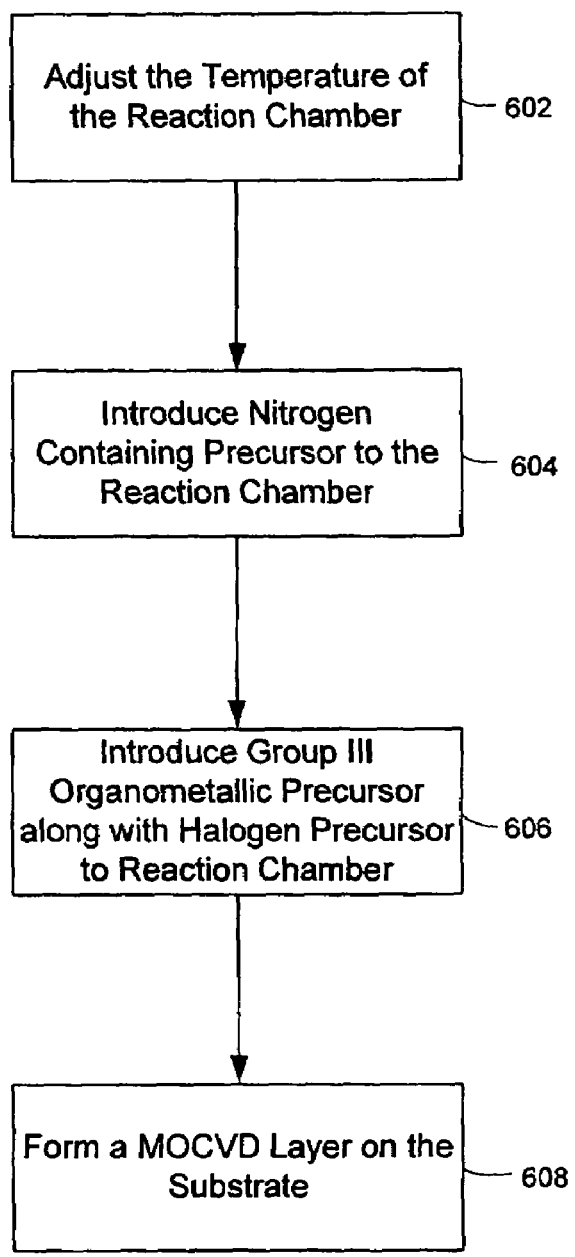
FIG. 6 is a flowchart illustrating steps in combined HVPE and MOCVD processes of forming III-V layers according to embodiments of the invention.

With reference to FIG. 6, following a HVPE formation of a first nitride epitaxial layer with etch pits at the lattice mismatch dislocations, a MOCVD method 600 for forming a subsequent nitride epitaxial overgrowth layer is illustrated.

When method 600 is performed in a single reaction chamber with, e.g., HVPE method 400, the process conditions in the chamber may be reconfigured for the second, MOCVD deposition. This reconfiguration may include stopping the flow of the Group III HVPE precursor, and adjusting the temperature of the reaction chamber at step 602 for the MOCVD deposition. A nitrogen containing gas at step 604 and Group III organo-metallic precursor along with a halogen precursor may then be introduced into the reaction chamber at step 606 to form the MOCVD layer on the etched HVPE layer and the substrate at step 608. The nitrogen containing gas may flow continuously during the deposition of the HVPE and MOCVD layer, or may be stopped between the depositions.

In another aspect of the invention, an alternative method for reducing dislocation density of nitride epitaxial layers of semiconductor structures is provided, wherein etch pits are formed as described above. However, prior to the subsequent nitride epitaxial layer overgrowth, a dielectric mask is applied to the etch pits. In this manner, without intending to be limited by theory, the dislocations are selectively filtered one-by-one, through the formation of micro-masks which are self-aligned over the dislocations.

Figure 7:
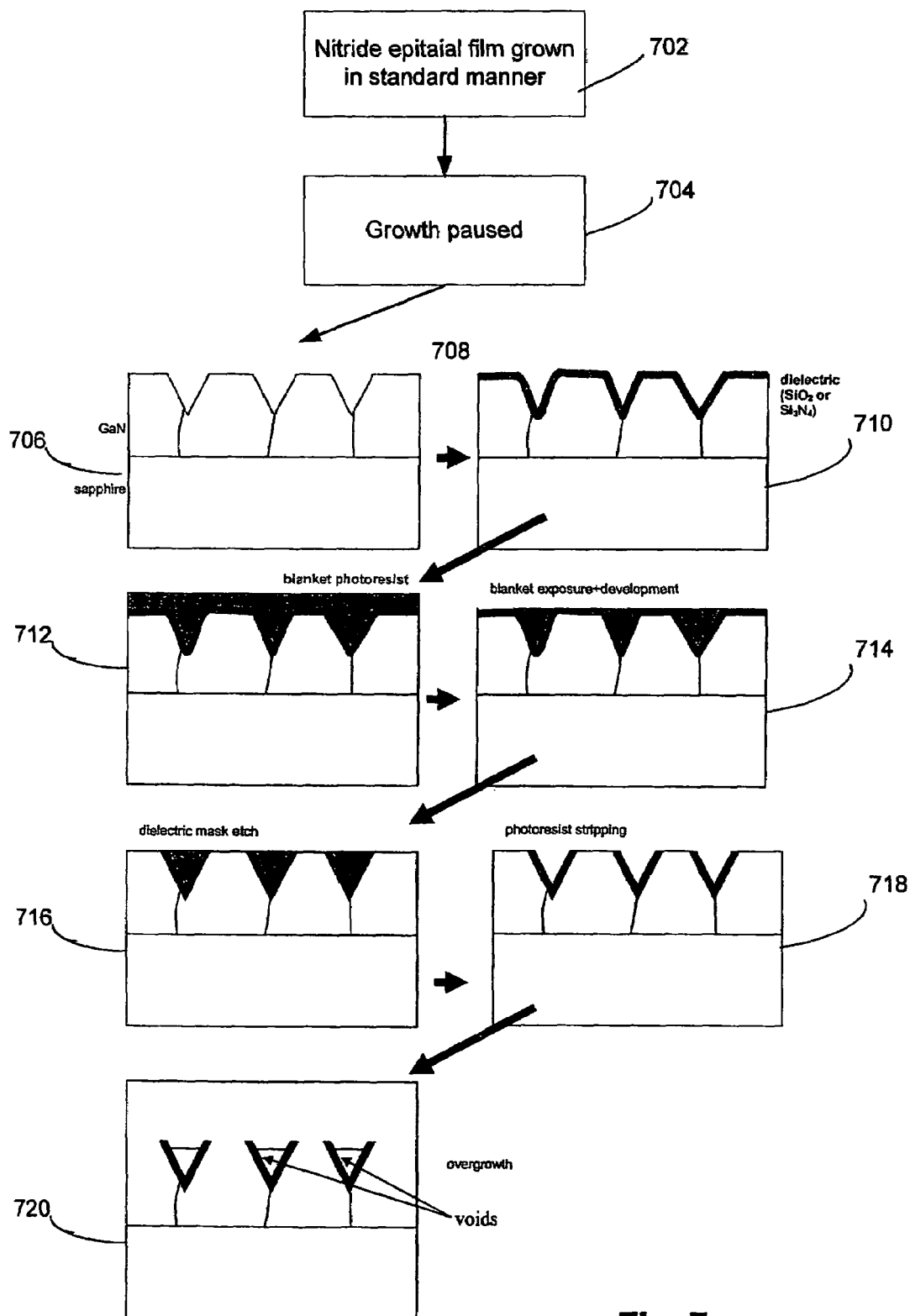
FIG. 7 is a flowchart illustrating steps in a method for reducing dislocation density of a nitride epitaxial layer according to embodiments of the invention.

More particularly, with reference to FIG. 7, method for reducing dislocation density of a nitride semiconductor structure comprising an epitaxial layer 700 is illustrated, wherein a nitride epitaxial film is grown in a standard manner known in the art or as described herein 702. Such films generally have a high density of threading dislocations. The growth is then paused 704, and the nitride epitaxial surface is etched with a corrosive halogen gas 706, e.g., HCl, to form an etched hexagonal pit. The etching conditions (temperature, HCl/$NH_3$/$H_2$/$N_2$ flows, illumination, etc.) are chosen such that the dislocations are preferentially attacked, thereby forming etch pits where the dislocations intersect the surface. Alternatively, the epitaxial nitride layer is preferentially etched at the lattice mismatch dislocations during formation of the epitaxial nitride layer such that etch pits are formed at the locations of the lattice mismatch dislocations while epitaxial nitride layer is simultaneous grown within the etch pits to thereby prohibit threading of the lattice mismatch dislocations through the epitaxial nitride layer (not shown). In either embodiment, the etching of the epitaxial nitride layer is then stopped 708 once the lattice mismatch dislocations are preferentially etched with etch pits.

Continuing to step 710, conformal dielectric is deposited (e.g., $SiO_2$ or $Si_3N_4$) over the etched nitride epitaxial layer; and a blanket photoresist is spun over the dielectric surface in any standard manner at step 712. Next, at step 714 a blanket exposure and development of the photoresist is performed to leave photoresist in the etch pits only. At step 716, the dielectric mask is etched to remove the mask in the areas between the etch pits, and the photoresist is stripped at step 718 to leave dielectric masks in the etch pits for the dislocation-specific epitaxial layer overgrowth (ELO) at step 720. In accordance with these embodiments of the invention, voids may be left within the original etch pits; however, such voids may be desirable to accommodate stress in the film. In this manner, the threading dislocations are filtered by the micro-sized dielectric masks, which are self-aligned to the dislocations.

As above, the nitride epitaxial layers that are to be etched may be formed in any suitable manner including the MOCVD and HVPE processes of method 300 or 400. Alternatively, the nitride epitaxial layers may be formed via standard MOCVD or HVPE processes known in the art, and standard etch processes may then be used after the nitride epitaxial layer including the lattice mismatch dislocations are formed. Further, as above, single reaction chamber processes or multi-reaction chamber processes may be used.

The dielectric layer may be deposited in any suitable manner and under any suitable conditions known in the art for such purposes. Generally, CVD processes will be used to deposit the dielectric layer using standard conditions known in the art, e.g., plasma enhanced CVD of $SiO_2$. Alternatively, a $Si_3N_4$ mask may be deposited in the epitaxial growth reactor immediately following the etch step. Thus, in a single chamber, in certain embodiments of the invention, an epitaxial nitride layer having lattice mismatch dislocations may be formed and the dislocations may be etched (as described above), then a $Si_3N_4$ masking layer may be deposited using, e.g., Silane ($SiH_4$) or other silicon precursor, along with ammonia. In certain embodiments, the CVD dielectric process may be carried out in a separate reaction chamber, if desired (e.g., a separate chamber in a cluster tool described below).

The photoresist application, exposure and development may be performed in any standard manner known in the art as well to leave photoresist in the etch pits only using standard conditions. Again, in certain embodiments, the photoresist spin chamber may be a separate reaction chamber from the epitaxial layer deposition and etch chamber(s), and the exposure/development steps may take place in the spin chamber or in separate exposure/development chamber(s), as known in the art. If desired, such chambers may be part of a cluster tool, as described below.

The dielectric mask etch and photoresist strip process may also be performed in any suitable manner known in the art under standard conditions. The etching and stripping processes may be performed with conventional wet chemistries as known in the art.

The nitride epitaxial layer overgrowth may be formed in any suitable manner known in the art, e.g., via MOCVD or HVPE processes such as those described above in methods 500 and 600. Again, the first nitride epitaxial layer with lattice mismatch dislocations that are etched and the subsequent nitride epitaxial overgrowth layer may be formed via MOCVD/HVPE processes as described above, in combination with the dielectric mask/photoresist processing to create the dielectric mask lined etch pits within the semiconductor structure. The process steps may be performed in a single reaction chamber, or in separate reaction chambers as desired, as discussed in further detail with reference to the cluster tool below.

In yet other aspects of the invention, the surface of various subsequent layers of the semiconductor structure of the invention may be further etched to increase surface roughness. In certain embodiments the etching may improve film quality or overall deposition rate of later layers. The etch process may be specifically limited to desired areas on the film surface that may benefit from surface roughness, such as areas where electrodes will be placed, patterns to reduce stress or increase light emission, etc. More particularly, the etch process may increase surface roughness to increase light output of the resultant LED. In yet other embodiments, the etch process may increase surface roughness to decrease film stress.

In certain embodiments, the subsequent nitride epitaxial overgrowth layer may be further etched, or additionally deposited Group-III Metal layers (as shown in FIG. 1) may be etched as desired. Without intending to be limited by theory, the in-situ etch processes of the invention are particularly suited for further etching of the surface of subsequent layers of the semiconductor structure, as the reaction chambers are configured for etching processes.

In certain aspects of the invention, with reference to the methods of FIGS. 2, 2A and 7, the epitaxial nitride layer that is etched may have a thickness of about 0.5 μm to about 20 μm, about 1 μm to about 10 μm, about 1 μm to about 5 μm, or about 2 μm to about 4 μm. In certain embodiments, the epitaxial nitride layer having the lattice mismatch dislocations may be deposited up to a thickness of about 1 μm to about 4 μm prior to initiation of the etching process. In other embodiments, the etching process is initiated at substantially the same time as the initiation of the growth of the epitaxial nitride layer itself. Further, as mentioned above, in certain embodiments, there may be growth of the epitaxial nitride layer observed with the etch pits if etching is commenced during growth of the epitaxial nitride layer.

In other aspects of the invention, again with reference to the methods of FIGS. 2, 2A and 7, the subsequent epitaxial nitride overgrowth layer may have a thickness of about 0.5 μm or more, about 1.0 μm or more, e.g., from about 0.5 μm to about 20 μm, about 1 μm to about 10 μm, or about 2 μm to about 4 μm. Further, due to the preferential etching of the dislocations, the methods of the invention may generally result in a dislocation density of the subsequent epitaxial nitride overgrowth layer of less than about 20%, about 15%, about 10%, about 5%, about 3%, about 2% etc.

III. Exemplary Substrate Processing System

Figure 8A:
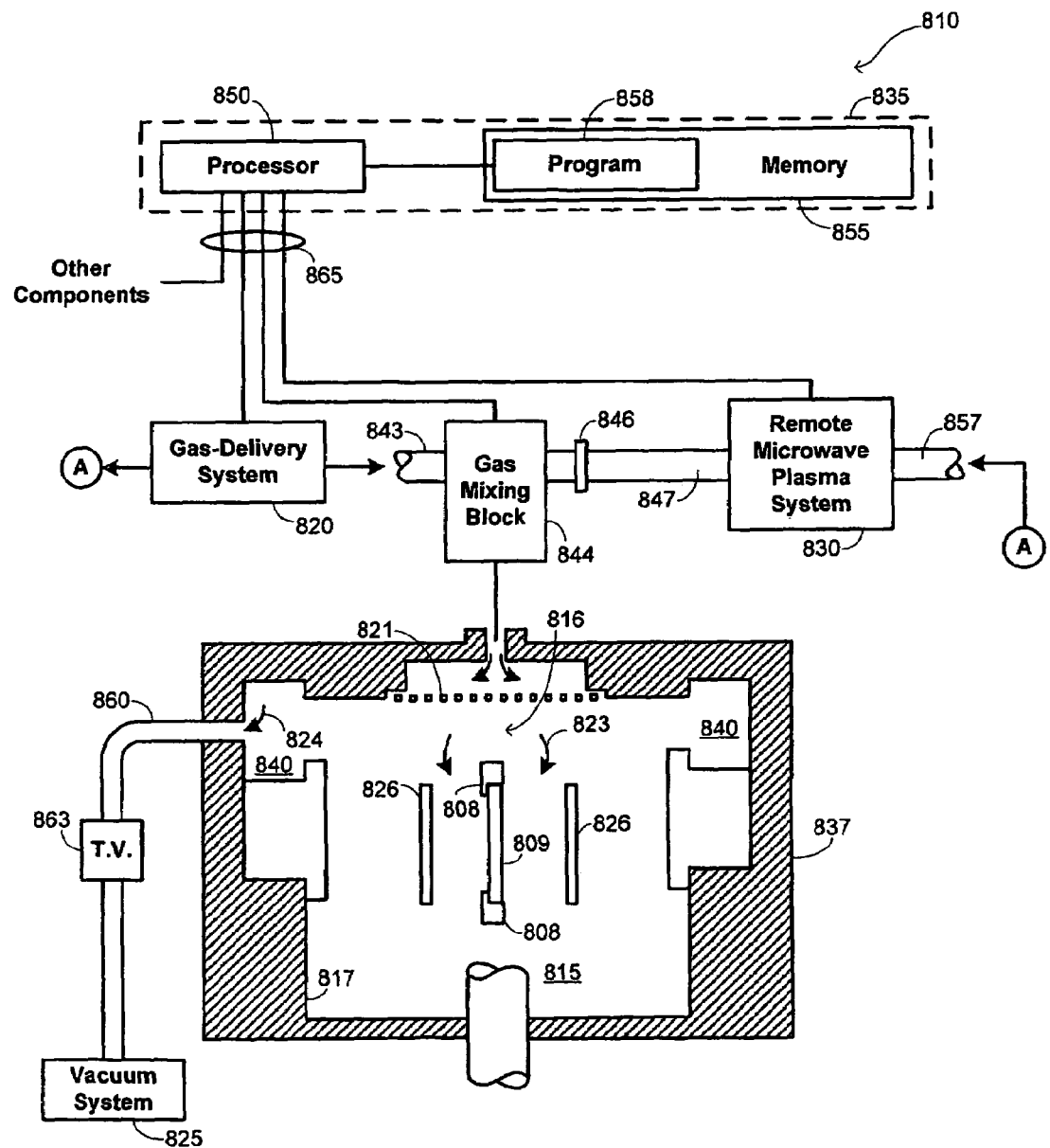
FIG. 8A is a simplified representation of an exemplary deposition apparatus that may be used in implementing embodiments of the invention.

FIG. 8A is a simplified diagram of an exemplary chemical vapor deposition ("CVD") system 810, illustrating the basic structure of a chamber in which individual deposition steps can be performed. This system is suitable for performing thermal, sub-atmospheric CVD ("SACVD") processes, as well as other processes, such as reflow, drive-in, cleaning, etching, deposition, and gettering processes. As will be evident from the examples described below, in some instances multiple-step processes can still be performed within an individual chamber before removal for transfer to another chamber. The major components of the system include, among others, a vacuum chamber 815 that receives process and other gases from a gas delivery system 820, a vacuum system 825, a remote plasma system 830, and a control system 835. These and other components are described in more detail below. In addition, specific description of structural arrangements that may be used to enable dual-sided deposition are provided below. While the drawing shows the structure of only a single chamber for purposes of illustration, it will be appreciated that multiple chambers with similar structures may be provided as part of the cluster tool, each tailored to perform different aspects of the overall fabrication process. Such cluster tools are described, e.g., in U.S. application Ser. No. 11/404,516, entitled "EPITAXIAL GROWTH OF COMPOUND NITRIDE SEMICONDUCTOR STRUCTURES," the contents of which are herein incorporated by reference. With regard to the present invention, certain of the chambers of the cluster tool may be specifically configured for etch processes, dielectric depositions, as well as photoresist spinning, exposure and development. Other components shown in the drawing for supporting the chamber processing may be shared among the multiple chambers, although in some instances individual supporting components may be provided for each chamber separately.

CVD apparatus 810 includes an enclosure assembly 837 that forms vacuum chamber 815 with a gas reaction area 816. A gas distribution plate 821 disperses reactive gases and other gases, such as purge gases, through perforated holes toward one or more substrates 809 held in position by a substrate support structure 808. Between gas distribution plate 821 and the substrate 809 is gas reaction area 816. Heaters 826 can be controllably moved between different positions to accommodate different deposition processes as well as for an etch or cleaning process. A center board (not shown) includes sensors for providing information on the position of the substrate.

Different structures may be used for heaters 826. For instance, some embodiments of the invention advantageously use a pair of plates in close proximity and disposed on opposite sides of the substrate support structure 808 to provide separate heating sources for the opposite sides of one or more substrates 809. Merely by way of example, the plates may comprise graphite or SiC in certain specific embodiments. In another instance, the heaters 826 include an electrically resistive heating element (not shown) enclosed in a ceramic. The ceramic protects the heating element from potentially corrosive chamber environments and allows the heater to attain temperatures up to about 1200° C. In an exemplary embodiment, all surfaces of heaters 826 exposed to vacuum chamber 815 are made of a ceramic material, such as aluminum oxide ($Al_2O_3$ or alumina) or aluminum nitride. In another embodiment, the heaters 826 comprises lamp heaters. Alternatively, a bare metal filament heating element, constructed of a refractory metal such as tungsten, rhenium, iridium, thorium, or their alloys, may be used to heat the substrate. Such lamp heater arrangements are able to achieve temperatures greater than 1200° C., which may be useful for certain specific applications.

Reactive and carrier gases are supplied from gas delivery system 820 through supply lines 843 into a gas mixing box (also called a gas mixing block) 844, where they are mixed together and delivered to gas distribution plate 821. Gas delivery system 820 includes a variety of gas sources and appropriate supply lines to deliver a selected amount of each source to chamber 815 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by system 810, some of the sources may actually be liquid sources rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art.

Gas mixing box 844 is a dual input mixing block coupled to process gas supply lines 843 and to a cleaning/etch gas conduit 847. A valve 846 operates to admit or seal gas or plasma from gas conduit 847 to gas mixing block 844. Gas conduit 847 receives gases from an integral remote microwave plasma system 830, which has an inlet 857 for receiving input gases. During deposition processing, gas supplied to the plate 821 is vented toward the substrate surface (as indicated by arrows 823), where it may be uniformly distributed radially across the substrate surface in a laminar flow.

Purging gas may be delivered into the vacuum chamber 815 from gas distribution plate 821 and/or from inlet ports or tubes (not shown) through the bottom wall of enclosure assembly 837. Purge gas introduced from the bottom of chamber 815 flows upward from the inlet port past the heater 826 and to an annular pumping channel 840. Vacuum system 825 which includes a vacuum pump (not shown), exhausts the gas (as indicated by arrows 824) through an exhaust line 860. The rate at which exhaust gases and entrained particles are drawn from the annular pumping channel 840 through the exhaust line 860 is controlled by a throttle valve system 863.

Remote microwave plasma system 830 can produce a plasma for selected applications, such as chamber cleaning or etching residue from a process substrate. Plasma species produced in the remote plasma system 830 from precursors supplied via the input line 857 are sent via the conduit 847 for dispersion through gas distribution plate 821 to vacuum chamber 815. Remote microwave plasma system 830 is integrally located and mounted below chamber 815 with conduit 847 coming up alongside the chamber to gate valve 846 and gas mixing box 844, which is located above chamber 815. Precursor gases for a cleaning application may include fluorine, chlorine and/or other reactive elements. Remote microwave plasma system 830 may also be adapted to deposit CVD layers flowing appropriate deposition precursor gases into remote microwave plasma system 830 during a layer deposition process.

The temperature of the walls of deposition chamber 815 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during an in situ plasma process, or to limit formation of deposition products on the walls of the chamber. Gas distribution manifold 821 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

System controller 835 controls activities and operating parameters of the deposition system. System controller 835 includes a computer processor 850 and a computer-readable memory 855 coupled to processor 850. Processor 850 executes system control software, such as a computer program 858 stored in memory 855. Memory 855 is preferably a hard disk drive but may be other kinds of memory, such as read-only memory or flash memory. System controller 835 also includes a floppy disk drive, CD, or DVD drive (not shown).

Processor 850 operates according to system control software (program 858), which includes computer instructions that dictate the timing, mixture of gases, chamber pressure, chamber temperature, microwave power levels, pedestal position, and other parameters of a particular process. Control of these and other parameters is effected over control lines 865, only some of which are shown in FIG. 8A, that communicatively couple system controller 835 to the heater, throttle valve, remote plasma system and the various valves and mass flow controllers associated with gas delivery system 820.

Processor 850 has a card rack (not shown) that contains a single-board computer, analog and digital input/output boards, interface boards and stepper motor controller boards. Various parts of the CVD system 810 conform to the Versa Modular European (VME) standard which defines board, card cage, and connector dimensions and types. The VME standard also defines the bus structure having a 16-bit data bus and 44-bit address bus.

Figure 8B:
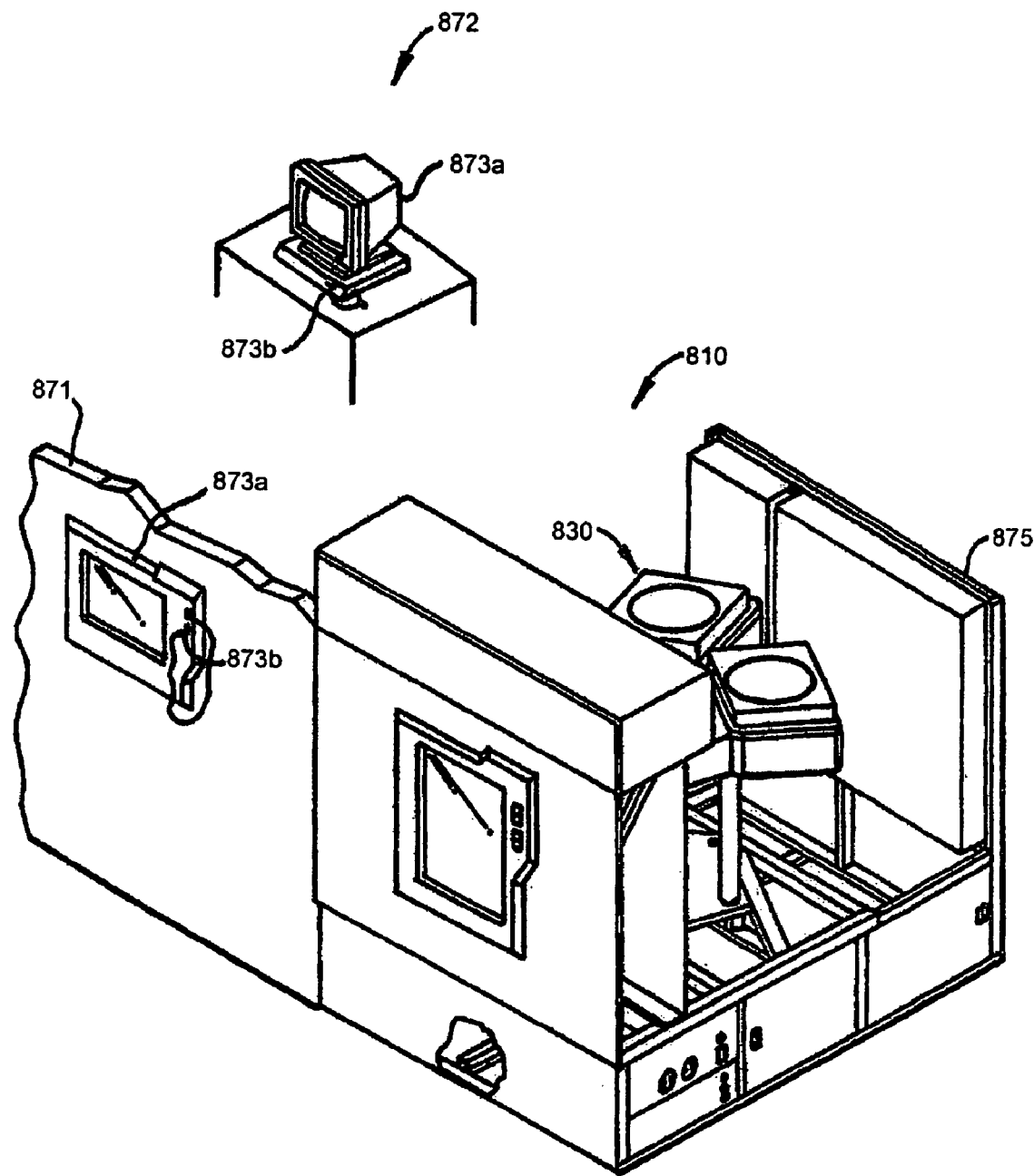
FIG. 8B is a simplified representation of an embodiment of a user interface for the exemplary deposition apparatus of FIG. 8A.

FIG. 8B is a simplified diagram of a user interface that can be used to monitor and control the operation of CVD system 810. FIG. 8B illustrates explicitly the multichamber nature of the cluster tool, with CVD system 810 being one chamber of the multichamber system. In such a multichamber system substrates may be transferred from one chamber to another via a computer-controlled robot for additional processing. In some cases the substrates are transferred under vacuum or a selected gas. The interface between a user and system controller 835 is a CRT monitor 873a and a light pen 873b. A mainframe unit 875 provides electrical, plumbing, and other support functions for the CVD apparatus 810. Exemplary multichamber system mainframe units compatible with the illustrative embodiment of the CVD apparatus are currently commercially available as the Precision 5000™ and the Centura 5200™ systems from APPLIED MATERIALS, INC. of Santa Clara, Calif.

In one embodiment two monitors 873a are used, one mounted in the clean room wall 871 for the operators, and the other behind the wall 872 for the service technicians. Both monitors 873a simultaneously display the same information, but only one light pen 873b is enabled. The light pen 873b detects light emitted by the CRT display with a light sensor in the tip of the pen. To select a particular screen or function, the operator touches a designated area of the display screen and pushes the button on the pen 873b. The touched area changes its highlighted color, or a new menu or screen is displayed, confirming communication between the light pen and the display screen. As a person of ordinary skill would readily understand, other input devices, such as a keyboard, mouse, or other pointing or communication device, may be used instead of or in addition to the light pen 873b to allow the user to communicate with the processor.

Figure 8C:
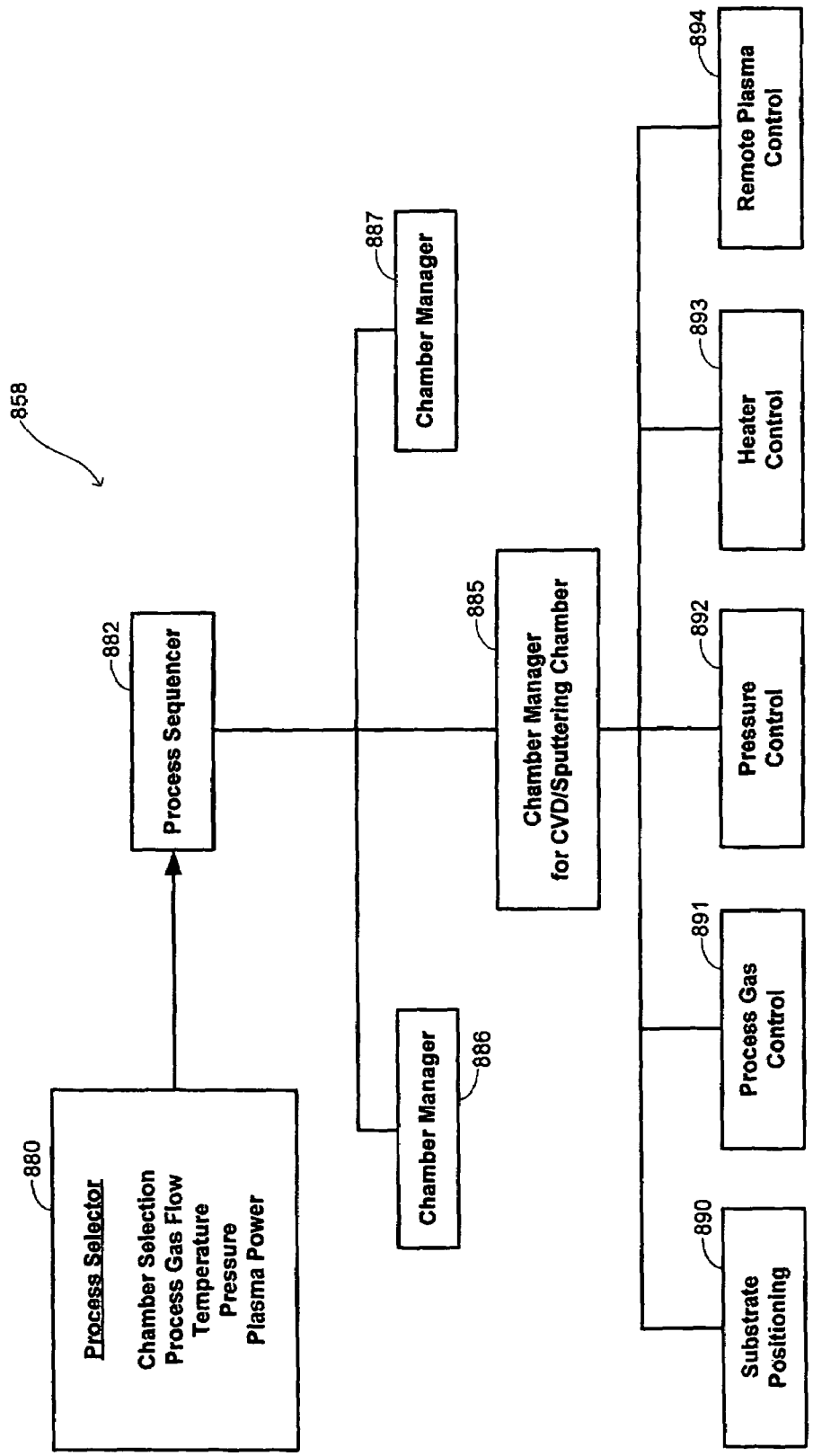
FIG. 8C is a simplified representation of an embodiment of a hierarchical control structure for system control software that may be used with the exemplary deposition apparatus of FIG. 8A.

FIG. 8C is a block diagram of one embodiment of the hierarchical control structure of the system control software, computer program 858, for the exemplary CVD apparatus of FIG. 8A. Processes such as those for depositing a layer, performing a dry chamber clean, or performing reflow or drive-in operations can be implemented under the control of computer program 858 that is executed by processor 850. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled Windows™ library routines. To execute the linked compiled object code, the system user invokes the object code, causing the computer system to load the code in memory, from which the CPU reads and executes the code to configure the apparatus to perform the tasks identified in the program.

A user enters a process set number and process chamber number into a process selector subroutine 880 by using the light pen to select a choice provided by menus or screens displayed on the CRT monitor. The process sets, which are predetermined sets of process parameters necessary to carry out specified processes, are identified by predefined set numbers. The process selector subroutine 880 identifies (i) the desired process chamber, and (ii) the desired set of process parameters needed to operate the process chamber for performing the desired process. The process parameters for performing a specific process relate to process conditions such as, for example, process gas composition and flow rates, pedestal temperature, chamber wall temperature, pressure and plasma conditions such as magnetron power levels. The process selector subroutine 880 controls what type of process (e.g., deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 882 has program code for accepting the identified process chamber and process parameters from the process selector subroutine 880, and for controlling the operation of the various process chambers. Multiple users can enter process set numbers and process chamber numbers, or a single user can enter multiple process set numbers and process chamber numbers, so process sequencer subroutine 882 operates to schedule the selected processes in the desired sequence. Preferably, process sequencer subroutine 882 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, process sequencer subroutine 882 can be designed to take into consideration the present condition of the process chamber being used in comparison with the desired process conditions for a selected process, or the "age" of each particular user-entered request, or any other relevant factor a system programmer desires to include for determining scheduling priorities.

Once process sequencer subroutine 882 determines which process chamber and process set combination is going to be executed next, process sequencer subroutine 882 initiates execution of the process set by passing the particular process set parameters to a chamber manager subroutine 885 which controls multiple processing tasks in a particular process chamber according to the process set determined by process sequencer subroutine 882. For example, chamber manager subroutine 885 has program code for controlling CVD and cleaning process operations in chamber 815. Chamber manager subroutine 885 also controls execution of various chamber component subroutines which control operation of the chamber components necessary to carry out the selected process set. Examples of chamber component subroutines are substrate positioning subroutine 890, process gas control subroutine 891, pressure control subroutine 892, heater control subroutine 893 and remote plasma control subroutine 894. Depending on the specific configuration of the CVD chamber, some embodiments include all of the above subroutines, while other embodiments may include only some of the subroutines or other subroutines not described. Those having ordinary skill in the art would readily recognize that other chamber control subroutines can be included depending on what processes are to be performed in the process chamber. In multichamber systems, additional chamber manager subroutines 886, 887 control the activities of other chambers.

In operation, the chamber manager subroutine 885 selectively schedules or calls the process component subroutines in accordance with the particular process set being executed. Chamber manager subroutine 885 schedules the process component subroutines much like the process sequencer subroutine 882 schedules which process chamber and process set are to be executed next. Typically, chamber manager subroutine 885 includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIGS. 8A and 8C. The substrate positioning subroutine 890 comprises program code for controlling chamber components that are used to load the substrate onto the heater 826 and, optionally, to lift the substrate to a desired height in the chamber to control the spacing between the substrate and the gas distribution manifold 821. When a substrate is loaded into the process chamber 815, the heater 826 is lowered to receive the substrate and then the heater 826 is raised to the desired height. In operation, the substrate positioning subroutine 890 controls movement of the heater 826 in response to process set parameters related to the support height that are transferred from the chamber manager subroutine 885.

Process gas control subroutine 891 has program code for controlling process gas composition and flow rates. Process gas control subroutine 891 controls the state of safety shut-off valves, and also ramps the mass flow controllers up or down to obtain the desired gas flow rate. Typically, process gas control subroutine 891 operates by opening the gas supply lines and repeatedly (i) reading the necessary mass flow controllers, (ii) comparing the readings to the desired flow rates received from the chamber manager subroutine 885, and (iii) adjusting the flow rates of the gas supply lines as necessary. Furthermore, process gas control subroutine 891 includes steps for monitoring the gas flow rates for unsafe rates, and activating the safety shut-off valves when an unsafe condition is detected. Alternative embodiments could have more than one process gas control subroutine, each subroutine controlling a specific type of process or specific sets of gas lines.

In some processes, an inert gas, such as nitrogen or argon, is flowed into the chamber to stabilize the pressure in the chamber before reactive process gases are introduced. For these processes, process gas control subroutine 891 is programmed to include steps for flowing the inert gas into the chamber for an amount of time necessary to stabilize the pressure in the chamber, and then the steps described above would be carried out. Additionally, when a process gas is to be vaporized from a liquid precursor, process gas control subroutine 891 is written to include steps for bubbling a delivery gas such as helium through the liquid precursor in a bubbler assembly, or controlling a liquid injection system to spray or squirt liquid into a stream of carrier gas, such as helium. When a bubbler is used for this type of process, process gas control subroutine 891 regulates the flow of the delivery gas, the pressure in the bubbler, and the bubbler temperature in order to obtain the desired process gas flow rates. As discussed above, the desired process gas flow rates are transferred to process gas control subroutine 891 as process parameters.

Furthermore, process gas control subroutine 891 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 892 includes program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control subroutine 892 is invoked, the desired or target pressure level is received as a parameter from the chamber manager subroutine 885. Pressure control subroutine 892 measures the pressure in the chamber by reading one or more conventional pressure manometers connected to the chamber, compares the measure value(s) to the target pressure, obtains proportional, integral, and differential ("PID") values corresponding to the target pressure from a stored pressure table, and adjusts the throttle valve according to the PID values. Alternatively, the pressure control subroutine 892 can be written to open or close the throttle valve to a particular aperture size, i.e., a fixed position, to regulate the pressure in the chamber. Controlling the exhaust capacity in this way does not invoke the feedback control feature of the pressure control subroutine 892.

Heater control subroutine 893 includes program code for controlling the current to a heating unit that is used to heat the substrate. Heater control subroutine 893 is also invoked by the chamber manager subroutine 885 and receives a target, or set-point, temperature parameter. Heater control subroutine 893 measures the temperature, which may be performed in different ways in different embodiments. For instance, a calibrated temperature may be determined by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. In another embodiment, a similar process may be performed with a pyrometer instead of a thermocouple to determine a calibrated temperature. Heater control subroutine 893 includes the ability to gradually control a ramp up or down of the heater temperature. In embodiments where the heater comprises a resistive heating element enclosed in ceramic, this feature helps to reduce thermal cracking in the ceramic, although this is not a concern in those embodiments that use a lamp heater. Additionally, a built-in fail-safe mode can be included to detect process safety compliance, and can shut down operation of the heating unit if the process chamber is not properly set up.

Remote plasma control subroutine 894 includes program code to control the operation of remote plasma system 830. Plasma control subroutine 894 is invoked by chamber manager 885 in a manner similar to the other subroutines just described.

Although the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part, is software, hardware or both. Those skilled in the art will also realize that it would be a matter of routine skill to select an appropriate computer system to control CVD system 810.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

What is claimed is:

1. A method for reducing dislocation density of a nitride semiconductor structure comprising an epitaxial layer, the method comprising:

providing a substrate to a reaction chamber;

forming an epitaxial nitride layer on the substrate, wherein the epitaxial nitride layer comprises lattice mismatch dislocations with the substrate, wherein forming the epitaxial nitride layer on the substrate comprises:

introducing at least one nitrogen containing precursor into the reaction chamber;

introducing a Group-III organo-metallic precursor and at least one etch compound into the reaction chamber, wherein the etch compound comprises a halogen compound and the at least one nitrogen-containing precursor reacts with the Group-III organo-metallic precursor to form a reaction mixture; and forming the epitaxial nitride layer on the substrate from the reaction mixture comprising the Group-III organo-metallic precursor and the at least one nitrogen-containing precursor under conditions sufficient to allow preferential etching of the lattice mismatch dislocations of the epitaxial nitride layer by the at least one etch compound during formation of the epitaxial nitride layer;

preferentially etching the lattice mismatch dislocations of the epitaxial nitride layer during formation of the epitaxial nitride layer such that etch pits are formed at the locations of the lattice mismatch dislocations while epitaxial nitride layer is simultaneously grown within the etch pits to thereby prohibit threading of the lattice mismatch dislocations through the epitaxial nitride layer;

stopping etching of the epitaxial nitride layer once the lattice mismatch dislocations are preferentially etched with etch pits; and forming a subsequent epitaxial nitride layer over the etched epitaxial nitride layer.

2. The method for reducing dislocation density of claim 1, wherein the substrate comprises an aluminum or silicon material.

3. The method for reducing dislocation density of claim 1, wherein the substrate comprises spinel, lithium gallate, or zinc oxide.

4. The method for reducing dislocation density of claim 1, wherein the group-III organo-metallic precursor comprises an organo-gallium compound.

5. The method for reducing dislocation density of claim 1, wherein the halogen compound comprises a hydrogen halide.

6. The method for reducing dislocation density of claim 1, wherein the second nitrogen-containing precursor comprises ammonia.

7. The method for reducing dislocation density of claim 1, wherein the epitaxial nitride layer comprises gallium nitride, or an alloy of gallium nitride.

8. The method for reducing dislocation density of claim 1, wherein the etch compound has a greater partial pressure in the reaction chamber than the group-III organo-metallic precursor.

9. The method for reducing dislocation density of claim 1, wherein forming the subsequent epitaxial nitride layer on the substrate comprises:
   introducing a nitrogen containing reagent gas into the reaction chamber;
   introducing a group-III metal containing reagent gas into the reaction chamber, wherein the group-III metal containing reagent gas is generated from the reaction of a group-III metal with a halogen containing gas and wherein the nitrogen containing reagent gas reacts with the group-III metal containing reagent gas to form an epitaxial reaction mixture; and
   forming the subsequent epitaxial nitride layer from the epitaxial reaction gas mixture.

10. The method for reducing dislocation density of claim 1, wherein the epitaxial nitride layer has a thickness of about 1 µm to about 5 µm, and the subsequent epitaxial nitride layer has a thickness of about 1 µm or more.

11. The method for reducing dislocation density of claim 1, wherein the dislocation density of subsequent epitaxial layer is reduced to less than about 15%.

12. The method for reducing dislocation density of claim 1, wherein the etched epitaxial layer and the subsequent epitaxial layer are formed in a single reaction chamber.

13. The method for reducing dislocation density of claim 1, wherein the etched epitaxial layer and the subsequent epitaxial layer are formed in separate reaction chambers.

14. The method for reducing dislocation density of claim 2, wherein the aluminum material comprises sapphire.

15. The method for reducing dislocation density of claim 2, wherein the silicon material comprises substantially pure silicon or silicon carbide.

16. The method for reducing dislocation density of claim 4, wherein the organo-gallium compound comprises trimethyl gallium.

17. The method for reducing dislocation density of claim 5, wherein the hydrogen halide comprises hydrogen fluoride, hydrogen chloride, hydrogen bromide, or hydrogen iodide.

18. The method for reducing dislocation density of claim 9, wherein the group-III metal reaction with the halogen containing gas is a liquid metal selected from the group consisting of aluminum, gallium, and indium.

19. The method for reducing dislocation density of claim 9, wherein the group-III metal containing reagent gas comprises aluminum chloride, gallium chloride, or indium chloride.

20. The method for reducing dislocation density of claim 9, wherein the halogen containing gas comprises hydrogen chloride.

21. The method for reducing dislocation density of claim 9, wherein the nitrogen containing reagent gas comprises ammonia.

22. The method for reducing dislocation density of claim 9, wherein the subsequent epitaxial layer comprises aluminum nitride, or indium nitride.

23. The method for reducing dislocation density of claim 9, wherein the subsequent epitaxial layer comprises gallium nitride, or alloys of gallium nitride.

* * * * *